United States Patent [19]

Hershcovitch

[11] Patent Number: 5,578,831
[45] Date of Patent: Nov. 26, 1996

[54] METHOD AND APPARATUS FOR CHARGED PARTICLE PROPAGATION

[75] Inventor: Ady Hershcovitch, Mount Sinai, N.Y.

[73] Assignee: Associated Universities, Inc., Washington, D.C.

[21] Appl. No.: 409,148

[22] Filed: Mar. 23, 1995

[51] Int. Cl.$^6$ ................................................ H01J 37/317
[52] U.S. Cl. ................ 250/398; 250/492.21; 219/121.24
[58] Field of Search ........................... 250/492.2, 492.21, 250/398; 219/121.24, 121.25, 121.26

[56] References Cited

U.S. PATENT DOCUMENTS

| | | | |
|---|---|---|---|
| 3,271,556 | 9/1966 | Harris | 219/121.24 |
| 3,388,235 | 6/1968 | Pinsley | 219/121.24 |
| 3,648,015 | 3/1972 | Fairbairn | 219/121.24 |
| 3,748,432 | 7/1973 | Bosworth et al. | 219/121 EB |
| 4,252,607 | 2/1981 | Thode . | |
| 4,269,658 | 5/1981 | Ohkawa | 376/125 |
| 4,604,752 | 8/1986 | Sequin et al. | 372/29 |
| 4,704,718 | 11/1987 | Suckewer . | |
| 4,929,811 | 5/1990 | Blankenship et al. | 219/121.54 |
| 5,010,229 | 4/1991 | Lamatsch et al. | 219/121.21 |
| 5,089,747 | 2/1992 | Koshiishi et al. | 315/111.81 |
| 5,382,866 | 1/1995 | Boggasch et al. | 250/396 ML |

OTHER PUBLICATIONS

Ning et al, "Electron–Plasma Beam (EPB) Welding —A Novel Non–Vacuum Electron Beam Welding Technology," Harbin Research Institute of Welding (HRIW), China, Sep. 1994, (Publication Unknown), pp: Title + pp. 1–7.

Bennett et al, "Magnetically Self–Focussing Streams", *Physical Review*, vol. 45, Jun. 15, 1984, pp. 890–897.

*Primary Examiner*—Bruce C. Anderson
*Attorney, Agent, or Firm*—Margaret C. Bogosian

[57] ABSTRACT

A method and apparatus are provided for propagating charged particles from a vacuum to a higher pressure region. A generator 14,14b includes an evacuated chamber 16a,b having a gun 18,18b for discharging a beam of charged particles such as an electron beam 12 or ion beam 12b. The beam 12,12b is discharged through a beam exit 22 in the chamber 16a,b into a higher pressure region 24. A plasma interface 34 is disposed at the beam exit 22 and includes a plasma channel 38 for bounding a plasma 40 maintainable between a cathode 42 and an anode 44 disposed at opposite ends thereof. The plasma channel 38 is coaxially aligned with the beam exit 22 for propagating the beam 12,12b from the chamber 16a,b, through the plasma 40, and into the higher pressure region 24. The plasma 40 is effective for pumping down the beam exit 22 for preventing pressure increase in the chamber 16a,b, and provides magnetic focusing of the beam 12,12b discharged into the higher pressure region 24.

30 Claims, 7 Drawing Sheets

METHOD AND APPARATUS FOR CHARGED PARTICLE PROPAGATION

This invention was made with Government support under contract number DE-AC02-76CH00016, between the U.S. Department of Energy and Associated Universities, Inc. The Government has certain rights in the invention.

The present invention relates generally to manufacturing processes using charged particle beams, and, more specifically, to electron beams used in welding and melting, and ion beam used in material modification.

BACKGROUND OF THE INVENTION

Electron beams are used in industry for welding of metals and for manufacturing alloys by selective melting. Ion beams are also used in industry for material modification by ion implantation, dry etching, and microfabrication. Such electron beam and ion beam manufacturing is typically performed in a vacuum since interaction between the charged particle beams and air molecules at atmospheric pressure causes rapid dispersion and attenuation of the beams which impairs their usefulness at relatively high pressures such as atmospheric pressure.

Electron beam welding has many well known advantages over other welding techniques including: very high depth-to-width ratio of the weldments; very high energy efficiency when electrical energy is converted directly into beam output energy; low distortions; and the ability to weld reasonably square butt joints without filler metal addition. Principle components of an electron beam welding column assembly include an electron gun, magnetic focusing coil, and a deflection coil contained in a vacuum housing or chamber. The electron gun must be held at a suitably low vacuum pressure below about $10^{-4}$ Torr. In order to effectively weld a workpiece, the workpiece is also typically contained in another chamber under vacuum. However, such vacuum welding of a workpiece results in relatively low production rates due to the required pumping time to suitably evacuate the chamber for each workpiece, and limits the practical size of a workpiece which may be contained in the vacuum chamber.

Non-vacuum electron beam welding may be practiced by maintaining the electron gun in a suitable vacuum, while providing a series of differentially pumped chambers between the electron gun and the workpiece which is maintained at atmospheric pressure. Although the pressure in each succeeding chamber increases for allowing the workpiece to be maintained at atmospheric pressure, the electron beam channeled through the chambers nevertheless experiences dispersion and attenuation which decrease its usefulness.

Material modification by ion implantation, dry etching, and micro-fabrication are commonly used technologies, all of which are necessarily performed in a vacuum since ion beams at energies used in these applications would otherwise be completely attenuated if passed through foil windows or through long differentially pumped sections such as would be required for maintaining the workpiece at atmospheric pressure.

Electron beam melting for manufacturing alloys is typically performed at a pressure of about $10^{-2}$ Torr. A major drawback of operating at this low pressure range is the loss of alloy elements with low vapor pressure. Accordingly, it is desirable to raise the operating pressure as high as possible and preferably as high as atmospheric pressure.

SUMMARY OF THE INVENTION

A method and apparatus are provided for propagating charged particles from a vacuum to a higher pressure region. A generator includes an evacuated chamber having a gun for discharging a beam of charged particles such as an electron beam or ion beam. The beam is discharged through a beam exit in the chamber into a higher pressure region. A plasma interface is disposed at the beam exit and includes a plasma channel for bounding a plasma maintainable between a cathode and an anode disposed at opposite ends thereof. The plasma channel is coaxially aligned with the beam exit for propagating the beam from the chamber, through the plasma, and into the higher pressure region. The plasma is effective for pumping down the beam exit for preventing pressure increase in the chamber, and provides magnetic focusing of the beam discharged into the higher pressure region.

BRIEF DESCRIPTION OF THE DRAWINGS

The invention, in accordance with preferred and exemplary embodiments, together with further objects and advantages thereof, is more particularly described in the following detailed description taken in conjunction with the accompanying drawings in which.

An enlargement of the circled portion is indicated by the arrow in FIG. 5.

DESCRIPTION OF THE PREFERRED EMBODIMENT(S)

Figure 1:
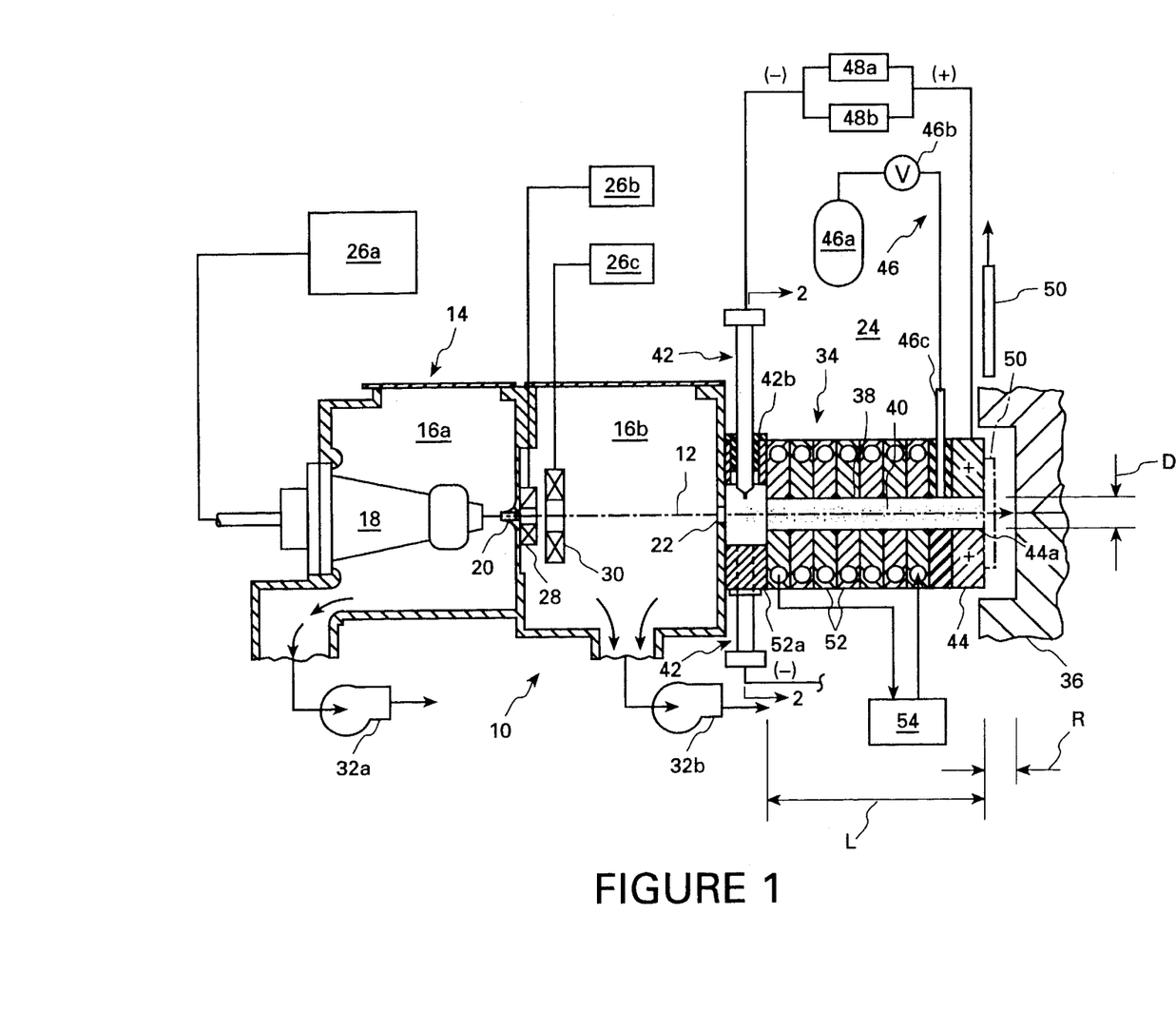
FIG. 1 is a schematic representation of a differential pressure charged particle propagating apparatus including a particle generator in a vacuum chamber for discharging an electron beam through a beam exit of the chamber into a higher pressure region containing a workpiece and a plasma interface for propagating the beam from the generator to the workpiece.

Illustrated schematically in FIG. 1 is a differential pressure charged particle propagating apparatus 10 in accordance with an exemplary embodiment of the present invention. The apparatus 10 includes conventional means for discharging a beam 12 of charged particles such as an electron beam illustrated, or an ion beam 12b described in an alternate embodiment hereinbelow. The electron beam 12 is formed by a conventional generator 14 which preferably includes two adjoining vacuum chambers 16a,b maintainable under a suitable vacuum. A conventional electron gun 18 is disposed in the first chamber 16a for discharging the electron beam 12 through the first chamber 16a, through a transfer orifice 20 between the common wall of the chambers 16a,b, through the second chamber 16b, and outwardly therefrom through an orifice forming a beam exit 22 in a back wall of the second chamber 16b and into a higher pressure region 24 adjoining the back wall of the second chamber 16b at the beam exit 22.

But for the beam exit 22 to the higher pressure region 24, the charged particle generator 14 is otherwise conventional in structure and operation and further includes a first power supply and controller 26a operatively joined to the electron gun 18 for generating an electron beam 12 of suitable energy, for example within the range of 100–200 keV. A conventional deflection coil 28 is suitably disposed in the second chamber 16b around the orifice 20 to suitably raster the beam 12 as required, and is operatively joined to a second power supply and controller 26b. A conventional magnetic focusing coil 30 is also disposed in the second chamber 16b downstream or down-beam from the deflection coil 28 and coaxially therewith for suitably focusing the beam 12 as desired, and is operatively joined to a third power supply and controller 26c.

In the preferred embodiment illustrated in FIG. 1, the first chamber 16a is operatively joined to a first vacuum pump 32a which preferably includes both a mechanical vacuum pump and a diffusion pump both of which are conventional for achieving relatively high vacuum within the first chamber 16a in which the electron gun 18 is disposed. A vacuum on the order of $10^{-4}$ Torr or greater is preferred for the first chamber 16a.

The second chamber 16b is operatively joined to a second vacuum pump 32b which may be a conventional mechanical pump or roots blower for providing a suitable vacuum therein on the order of about $10^{-3}$ Torr to one Torr. Although both chambers 16a,b may be joined to common vacuum pumps and both evacuated to the same vacuum pressure, the two chambers 16a,b have their own respective pumps as described above and therefore provide two-stage vacuum through which the beam 12 is initially propagated.

In accordance with the present invention, the beam 12 may be discharged from the particle generator 14 through its beam exit 22 into the higher pressure region 24 which is maintained at a pressure greater than the vacuum in the chamber 16a,b. This includes lesser vacuum pressures, atmospheric pressure, or even greater than atmospheric pressure if desired. The higher pressure region 24 may merely be a suitably open region within a building maintained at standard atmospheric pressure and temperature or may yet be another chamber maintained at a higher pressure than that in the particle generator 14.

However, in order for the beam 12 to propagate in the higher pressure region 24 without dispersion and attenuation by interaction with the gas molecules therein, means in the form of a plasma interface or window 34 are disposed at the beam exit 22 for passing or propagating the beam 12 from the second chamber 16b and into the higher pressure region 24 wherein the beam 12 may be used for electron beam welding a suitable workpiece 36 for example. The plasma interface 34 preferably includes an annular plasma confinement channel 38 for bounding a plasma 40, shown schematically by stippling, which is maintainable between a cathode 42 and an anode 44 disposed at opposite ends of the channel 38. The plasma channel 38 is coaxially aligned with the beam exit 22 for passing or propagating the beam 12 from the vacuum chambers 16a,b, through the plasma 40, and into the higher pressure region 24 for electron beam welding the workpiece 36 for example.

The plasma 40 may be formed of any suitable gas, such as helium, argon, or nitrogen, which is highly ionized and contains positive ions and electrons. The plasma 40 may have a high temperature on the order of about 15,000° K. and provides several significant operational advantages when used as a window or interface for propagating the electron beam 12 from the generator 14 into the higher pressure region 24.

In the case where the higher pressure region 24 is at atmospheric pressure, the plasma 40 provides an effective separation between the vacuum in the generator 14 and the atmospheric region 24, and may even act as a pump itself. The most significant effect of the plasma 40 is due to pressure equalization when the plasma 40 discharges to the region 24, or atmosphere. Since the region 24 may be maintained at room temperature of about 300° K., and since the plasma 40 may reach a temperature of about 15,000° K., the density of the plasma is about 1/50 of atmospheric density for pressure equalization. Accordingly, the effect of the plasma interface 34 at the beam exit 22 should reduce the pressure in the second chamber 16b substantially, by a factor up to about 50 based on this simple principle. In this way, the plasma 40 is effective for pumping down the beam exit 22 which prevents increase in the pressure within the vacuum chamber 16b due to flow communication with the higher pressure region 24. Without the interface 34, atmospheric pressure would degrade the vacuum in the chamber 16b, but with the interface 34 the vacuum within the chamber 16b may be maintained, as well as be increased thereby.

The plasma interface 34 may be configured so that heavy particles, such as molecular and atomic ions, migrate toward the higher pressure region 24 to create a fluid flow that counters the flow of the higher pressure atmospheric gas which would otherwise tend to enter the beam exit 22. This may be accomplished by the preferred orientation of the cathode 42 and the anode 44 as described hereinbelow.

Furthermore, molecules and atoms entering the plasma 40 are ionized by the plasma particles and are subsequently confined by the fields containing the plasma 40. The effect is important only in cases where gas flows are low, since at steady state high flowrates, the plasma pressure will build up quickly and exceed the pressure exerted by the confining fields. Yet another effect occurs since pumping-down speed increases with increasing particle temperature especially in the molecular flow range. However, in most cases of interest, particles will be cooled to room temperature by collisions with the vacuum chamber walls before being pumped outwardly therefrom by the second vacuum pump 32b.

Another significant advantage of the plasma interface 34 is that it may act as a plasma focusing lens to focus the beam 12 being propagated therethrough by preferentially orienting the electrical current in the plasma 40 relative to the direction of the particle beam. In a beam of charged particles, there are two forces acting on the particles: space charge forces trying to blow the beam up, and a magnetic force pinching the beam due to the magnetic field generated by the beam itself. The magnetic force is a consequence of the conventional Lorentz force which is a function of particle charge, velocity, and magnetic field. When a beam enters a plasma, space charge forces are neutralized, and, therefore, beam focusing results from the magnetic field. In all cases of interest to this subject matter, the large electrical currents generated in the plasma 40 far exceed the electrical current in the beam 12, and therefore azimuthal magnetic fields resulting from the plasma current are dominant. For the electron beam 12, the axial electrical current in the plasma 40 is preferably opposite to the direction of the beam 12 itself to ensure magnetic focusing. For the positive ion beam 12b, described below, the axial electrical current in the plasma 40 is preferably in the same direction as the beam 12b itself to ensure magnetic focusing. Therefore, so focusing the beam 12,12b improves its efficacy when directed toward the workpiece 36.

The feasibility of transporting the electron beam 12 through the plasma interface 34, especially through a relatively long, narrow plasma channel 38 may be examined using conventional models. One model may be used for balancing beam expansion due to scattering with beam focusing by plasma generated magnetic fields. Unless otherwise constrained, the beam envelope or its radius will grow along its propagation axis and therefore attenuate and disperse. Beam growth may be reduced or eliminated by radially inwardly directed Lorentz acceleration which may be effected by the magnetic field generated in the plasma 40. For example, one calculation predicts that for a helium plasma channel of about 1 mm radius, an electron beam energy of 175 keV, a plasma current of about 29 amperes is required to effect an azimuthal magnetic field to eliminate divergence of the electron beam due to scattering. Larger electrical currents, therefore, may be used to further focus the electron beam 12 as desired. These large electrical currents are preferably three to four orders of magnitude larger than the electrical currents typically found in the electron beams used for welding.

Accordingly, welding, for example, of the workpiece 36 at atmospheric pressure may be accomplished by generating the beam 12 in a vacuum; forming the plasma 40 at the beam exit 22; and propagating the beam 12 through the plasma 40 from the vacuum and into the higher pressure region 24 containing the workpiece 36. The plasma 40 is effective for sealing the beam exit 22 from the higher pressure region 24 as well as providing pumping-down of the second chamber 16b. The plasma 40 magnetically focuses the beam 12 for reducing attenuation and dispersion thereof. And, the plasma interface 34 also prevents undesirable back-streaming of the welding debris from the workpiece 36 into the beam exit 22.

As shown in FIG. 1, the plasma interface 34 further includes means 46 for injecting a plasma-forming gas, such as helium or argon for example, into the plasma channel 38 at any suitable location such as between the cathode 42 and the anode 44. The gas injecting means 46 includes a gas supply 46a such as a bottle containing helium gas, a control valve 46b joined in flow communication therewith, and a supply conduit 46c effective for discharging the gas into the plasma channel 38 adjacent to the anode 44 for example.

Suitable means for supplying electrical power or current to the cathode 42 and the anode 44 are provided to form the plasma 40 therebetween in the plasma channel 38. In the exemplary embodiment illustrated in FIG. 1, two power supplies 48a,b are operatively connected to the cathode 42 and the anode 44 for in turn initiating the plasma 40 under vacuum and then maintaining the plasma 40 at high pressure, which may be atmospheric pressure for example. The first power supply 48a preferably provides high voltage of about 1,500 volts D.C. and low current of about 100 milliamps for initiating the plasma 40. A movable door 50 may be initially positioned at the discharge end of the plasma interface 34, against the anode 44 for example, so that the second vacuum pump 32b may be used to initially evacuate both the second vacuum chamber 16b and the plasma interface 34 itself. The plasma-forming gas may then be injected through the supply conduit 46c into the plasma channel 38, with the higher voltage power supplied by the first power supply 48a initiating the plasma 40 within the channel 38.

The second power supply 48b may then be used to maintain the plasma 40 after the door 50 is removed or opened which joins the plasma channel 38 directly in flow communication with the higher pressure region 24. The second power supply 48b is preferably a low voltage, high current power supply, for example 100–200 volts D.C. at up to 50 amps or greater if desired. The high current provided by the second power supply 48b is effective for maintaining the plasma 40 at the relatively high pressure of the higher pressure region 24, e.g. atmospheric pressure.

Figure 2:
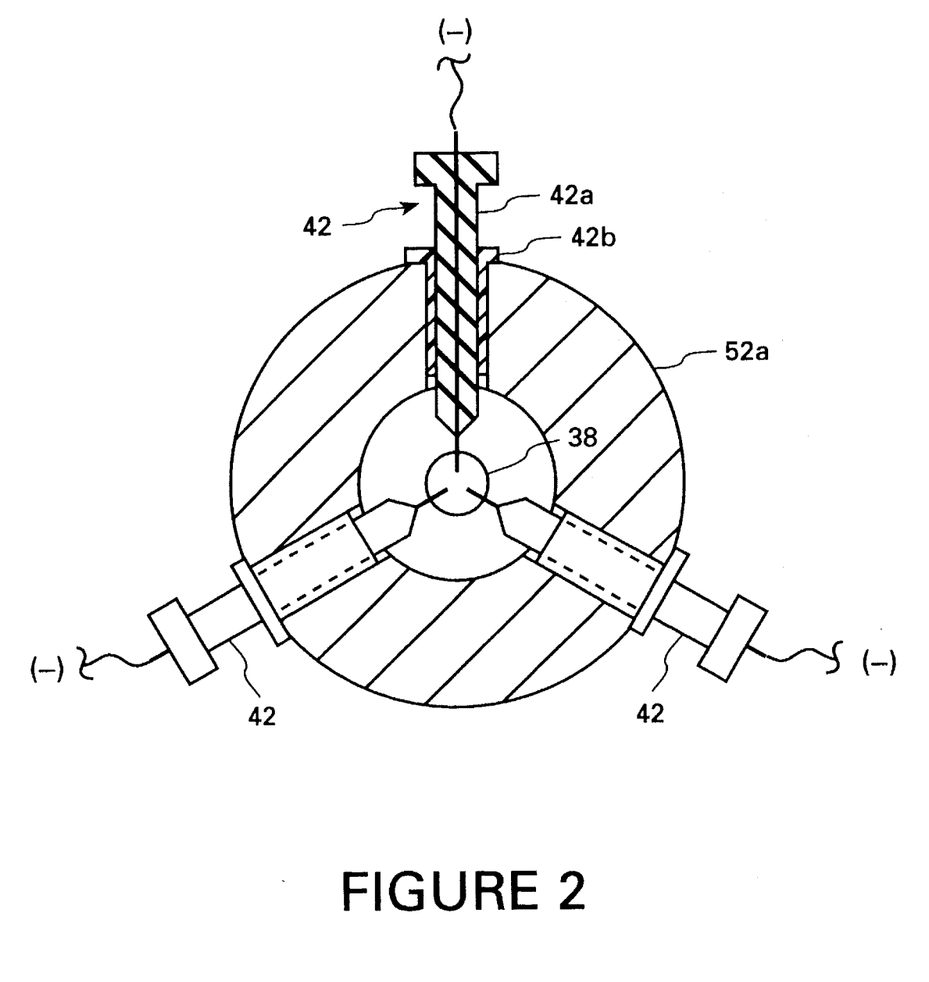
FIG. 2 is a partly sectional view of one end of the plasma interface illustrated in FIG. 1 taken along or near line 2—2 through a plurality of cathodes thereof (but two cathodes are not shown in cross-section).

In the exemplary embodiment illustrated in FIG. 1, the anode 44 is in the form of a disc having a central aperture coaxially aligned with the plasma channel 38 which provides a beam outlet 44a for the plasma interface 34. Although the cathode 42 could also be in the form of a similar disc, the cathode preferably is in the form of a plurality of circumferentially spaced apart needle cathodes 42 having sharp distal ends disposed adjacent to the plasma channel 38 as additionally shown in FIG. 2. Each of the cathodes 42 includes a suitable tubular housing 42a through which the needle cathode element extends, with the respective cathodes 42 being equiangularly spaced apart at about 120° from each other in a common housing. In the embodiment illustrated, the needle cathodes 42 extend through a first one 52a of several cooling plates 52 described below through a suitable electrically insulating sleeve 42b. The needle cathodes 42 are preferred for increasing ionization of the plasma 40 during operation, as compared to a disc cathode having relatively little ionization ability. In a preferred embodiment, the needle cathode elements are preferably Thoriated-Tungsten and are effective for ionizing helium gas to a level in the range of about 20–50%. Increased ionization of the plasma 40 provides substantially improved performance of the plasma 40 for propagating the beam 12 therethrough.

The plasma channel 38 is preferably elongate, or long and narrow for extending the reach of the plasma interface 34 into the higher pressure region 24 and allowing it to be used for welding in relatively small crevices in the workpiece 36 as shown in FIG. 1. However, by elongating the plasma channel 38 and correspondingly the plasma therein, suitably means are required for stabilizing the plasma 40 therein generally coaxially with the beam 12 for maintaining acceptable performance of the plasma interface 34. The plasma 40 is preferably an elongate cascaded arc or stream which will wander from the axis of the beam 12 unless stabilized. In the exemplary embodiment illustrated in FIG. 1, the plasma channel 38 has a diameter D of about 2.36 mm and a length L of about 6 cm, with the length being substantially greater than the diameter, with a high L/D ratio of about 25.4.

In order to stabilize the correspondingly long and narrow plasma 40, the stabilizing means are preferably effective for providing a lower temperature boundary around the hot plasma 40. The electrical conductivity of the plasma 40 is directly proportional to its temperature, i.e. $T^{3/2}$. By providing a lower temperature boundary around the plasma 40, as it meanders or wanders radially outwardly from the beam 12, it will experience a decrease in temperature which increases its electrical resistance. The plasma 40 will follow the path of least electrical resistance and will therefore be redirected radially inwardly toward the beam 12 where the density is lowest and the electrical resistance is least. In this way, the plasma 40 is stabilized generally concentrically around the beam 12 for more effectively allowing the beam 12 to propagate therethrough and be focused thereby.

In one exemplary embodiment illustrated in FIG. 1, the stabilizing means include a plurality of coaxially stacked together annular cooling plates 52, which may also take the form of conventional cooling fins, with the plates 52 collectively having a central bore which defines the plasma channel 38 therethrough. The plates 52 may be formed of a suitable high thermal conductivity metal such as Cu, Al, Mo, Ta, etc. Suitable means 54 for circulating a cooling fluid through the cooling plates 52 are provided for removing heat therefrom to establish the lower temperature boundary around the plasma 40. In one embodiment, the cooling means 54 include a suitable supply of a cooling fluid such as water or air which is circulated under pressure through suitable conduits passing through the cooling plates 52. During operation, heat is transmitted radially outwardly by conduction through the cooling plates 52 and is removed by the cooling fluid circulating therethrough. Accordingly, by circulating the cooling fluid around the plasma channel 38, heat is removed therefrom for stabilizing the plasma 40.

Experimental tests have been conducted to confirm the efficacy of the plasma interface 34. In one test, a plasma channel 38 in simple tube form having a length of about 6 cm and a diameter of about 2.36 mm was joined to a vacuum chamber. In another test, a similar plasma channel 38 was mounted on a conventional electron beam welder. Both tests confirmed the substantial pumping-down effect of the plasma interface 34 with a pressure reduction in the vacuum chamber by a factor of about 229 for example. Copper and stainless steel plates mounted in atmospheric pressure were also effectively electron beam welded, using such an interface. For example, the range R between the discharge end of the plasma interface 34 and the workpiece 36 as illustrated in FIG. 1 may be about 1 cm or more, without causing unacceptable degradation of the e-beam.

Figure 3:
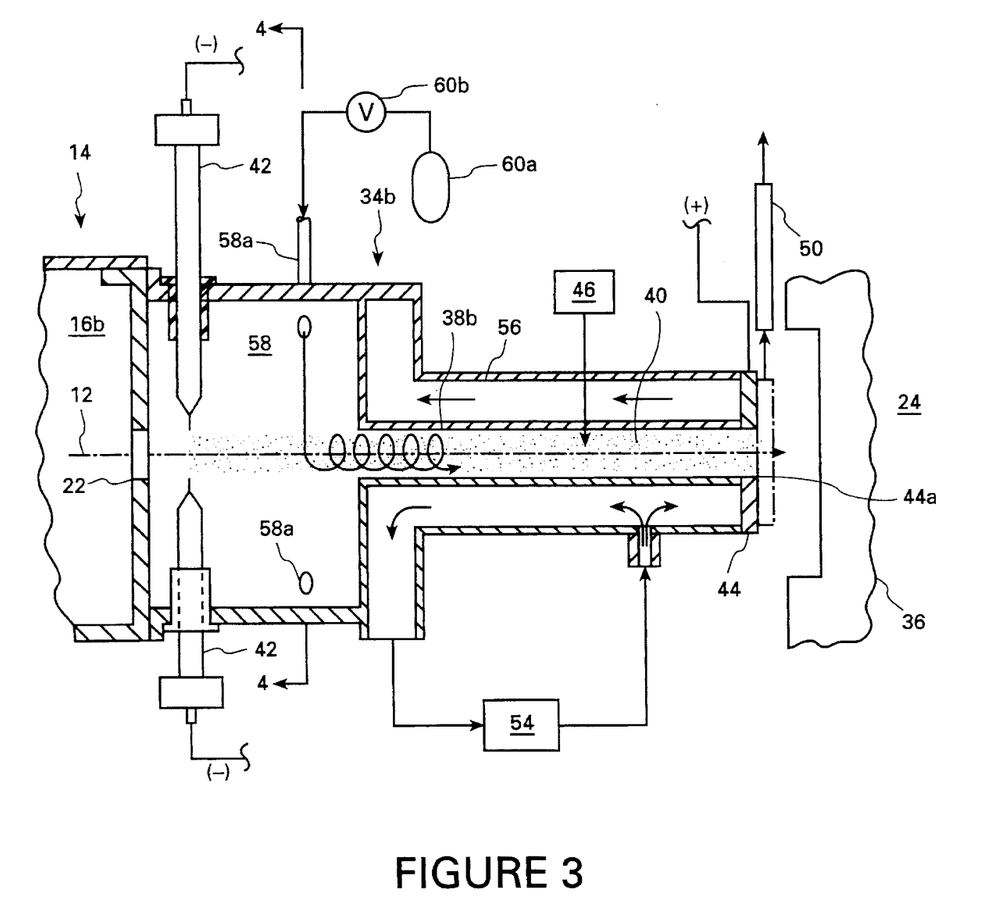
FIG. 3 is a schematic representation of a vortex stabilized plasma interface in accordance with a second embodiment of the present invention joined to the particle generator of FIG. 1.
Figure 4:
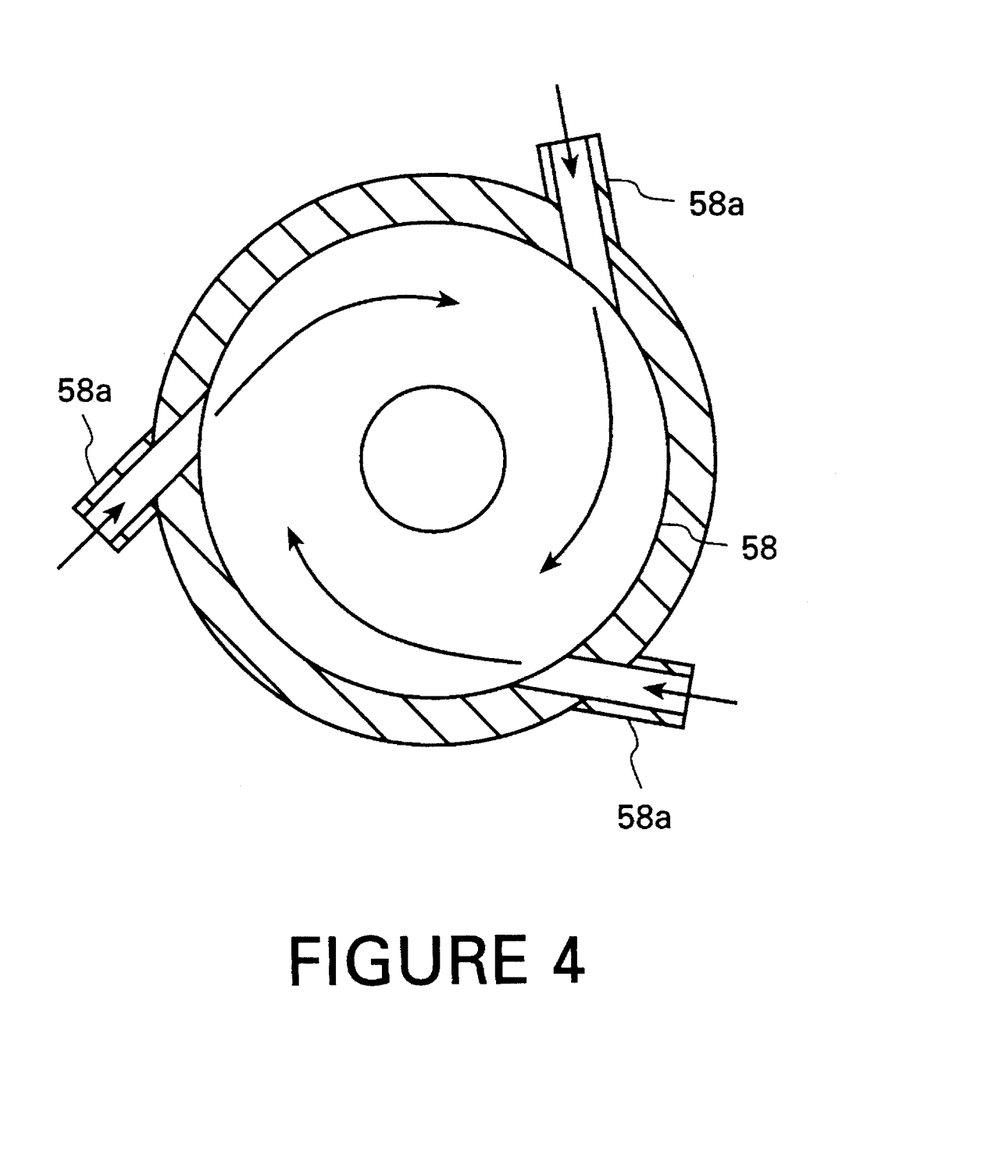
FIG. 4 is a sectional view through one end of the plasma interface illustrated in FIG. 3 and taken along line 4—4 through a plurality of inclined gas inlet ports.

Illustrated in FIG. 3 is another embodiment of a plasma stabilizing means wherein a cooling gas is circulated in a vortex around the plasma 40 inside the plasma channel 38b. This vortex stabilized plasma interface, designated 34B, has a tubular plasma channel 38b extending coaxially between the needle cathodes 42 and the annular anode 44. The vortex stabilizing means include a tubular cooling channel 56 disposed concentrically around the narrow, downstream portion of the plasma channel 38b and is spaced radially outwardly therefrom. The upstream end of the plasma channel 38b is enlarged to define an annular inlet plenum 58 disposed coaxially in flow communication with the narrow portion of the plasma channel 38b. The inlet plenum 58 is disposed downstream of the beam exit 22. It preferably includes the needle cathodes 42, and a plurality of generally tangentially inclined inlet ports 58a as illustrated in more particularity in FIG. 4. Suitable means including a gas supply or reservoir 60a and cooperating control valve 60b are operatively joined to the three equally spaced apart inlet ports 58a for providing a suitable stabilizing gas such as helium or argon into the inlet plenum 58 to form a vortex flowing downstream or down-beam around the plasma 40.

In this embodiment, the cooling fluid circulating means 54 is operatively joined to the cooling channel 56 for circulating the cooling fluid such as water around at least the narrow portion of the plasma channel 38b. In this way, the cooling provided by the cooling channels 56, and the vortex established by the inlet plenum 58 both contribute to providing enhanced stability of the elongate plasma 40 confined within the plasma channel 38b.

Furthermore, the vortex fluid injected through the inlet ports 58a may be used both for providing a stabilizing vortex around the plasma 40 as well as providing the gas used for creating the plasma 40 itself. Alternatively, the plasma-forming gas injecting means 46 found in the FIG. 1 embodiment may also be used in the FIG. 3 embodiment if desired for separately providing the gas which forms the plasma 40, with the vortex gas being introduced primarily only for stabilizing the plasma 40.

Figure 5:
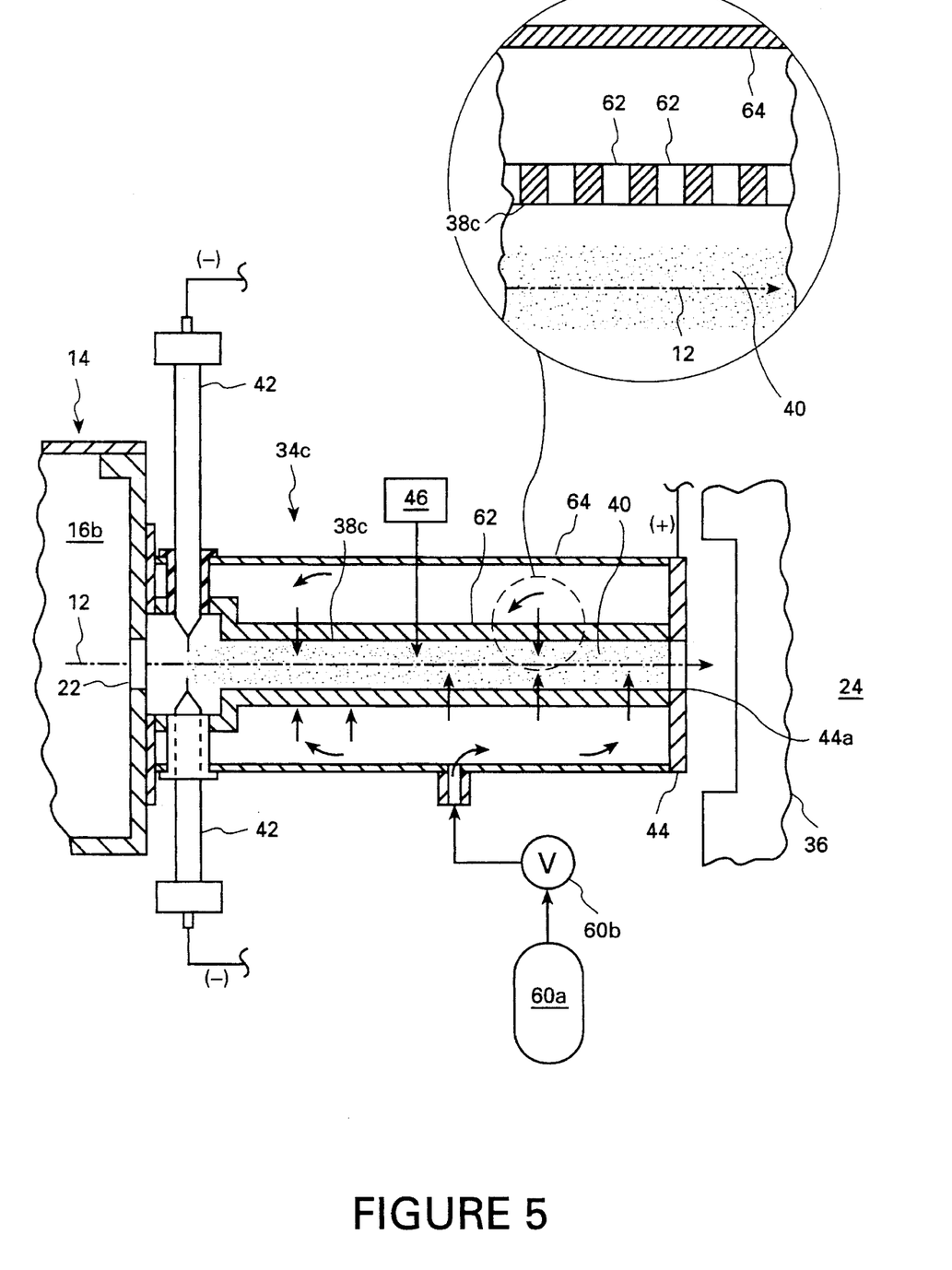
FIG. 5 is a schematic representation of a transpiration stabilized plasma interface in accordance with a third embodiment of the present invention joined to the particle generator of FIG. 1.

Illustrated in FIG. 5 is yet another embodiment of means for stabilizing the plasma 40. In this embodiment, a cooling gas such as helium or argon is used to provide a transpiration stabilized plasma interface designated 34C which effects transpiration cooling around the plasma 40 within the plasma channel designated 38c. The plasma channel 38c is a tubular member having a plurality of transpiration cooling holes 62 (see also FIG. 5a) extending radially through the entire outer surface thereof to form a substantially perforated plasma channel 38c. Disposed concentrically around the plasma channel 38c is a tubular cooling duct 64 spaced radially outwardly therefrom. Suitable means such as the gas supply 60a and its cooperating control valve 60b are operatively joined to the cooling duct 64 for supplying a suitable cooling gas such as helium or argon into the cooling duct 64 for discharge radially inwardly through the many transpiration cooling holes 62 to completely surround the plasma 40 within the plasma channel 38c. The transpiration cooling gas provides effective stabilization of the plasma 40 located radially inwardly therefrom. The transpiration cooling gas, such as helium, may also be used for forming the plasma 40 itself if desired, or the plasma-forming gas injecting means 46 of FIG. 1 may also be used in this embodiment for providing a separate supply to form the plasma 40, with the transpiration cooling gas being used primarily for the stabilization thereof.

In all of the exemplary embodiments disclosed in FIGS. 1–5, the particle gun 18 is effective for discharging an electron beam 12, with the needle cathodes 42 being preferably disposed adjacent to the beam exit 22, with the anode 44 being disposed down-beam therefrom to define the beam outlet 44a of the respective plasma interfaces 34, 34B, and 34C. This orientation of the cathodes 42 and anode 44 relative to the propagation direction of the electron beam 12 greatly enhances the magnetic focusing effects of the stabilized plasma 40 on the electron beam 12.

Furthermore, the discharge end of the respective plasma interfaces may be made relatively small so that the beam outlets 44a may be positioned relative to the workpiece 36 disposed in the higher pressure region 24 for electron beam welding of the workpiece 36 with the electron beam 12. In particular, the relatively small size allows welding within crevices formed in the workpiece 36 which improves the utility of the invention.

As indicated above, the particle generator 14 must be evacuated to a suitably high vacuum for the effective generation of the electron beam 12. For example, vacuum pressures on the order of about $10^{-4}$ and $10^{-5}$ Torr are typical therein. And, the plasma interfaces described above are effective not only for preventing vacuum loss in the particle generator 14, but for effectively pumping-down the second vacuum chamber 16b during operation. In the exemplary embodiment illustrated in FIG. 1, two stage differential pumping of the respective first and second vacuum chambers 16a,b is provided, with the plasma interface 34 being effective for pumping-down the second chamber 16b for obtaining effective propagation of the electron beam 12 through the entire length of the plasma interface 34 within the higher pressure region 24 and to an effective range R therefrom of at least about 1 cm. This significantly reduces or eliminates the several differential pumping stages previously used for obtaining non-vacuum electron beam welding.

In one embodiment, the higher pressure region 24 may simply be maintained at atmospheric pressure, although the pressure thereof may be higher than atmospheric if desired, up to 2–3 atmospheres for example, or the pressure therein may be a vacuum less than the vacuum initiated in the second chamber 16b. In this way, the plasma interface 34 may be used in any suitable application to provide an effective interface for the electron beam 12 from one region of low pressure to an adjacent region of higher pressure which would otherwise disperse and attenuate the electron beam 12.

Although the various embodiments of the apparatus 10 described above are specifically configured for electron beam welding of a workpiece in a higher pressure region, such as at atmosphere, the apparatus 10 may also be configured for suitably melting a workpiece in the manufacturing of material alloys if desired. Electron beam melting for manufacturing alloys is typically performed at a pressure of about $10^{-2}$ Torr. A major drawback of operating at this pressure range is the loss of elements with low vapor pressure, and therefore by raising the operating pressure in the higher pressure region 24 wherein the workpiece is located, this problem may be reduced or eliminated, such as operation at atmospheric pressure.

Furthermore, the apparatus 10 may also be configured for generating an ion beam which may be used in the conventional practices of ion material modification such as by ion implantation, dry etching, or micro-fabrication. These processes are presently performed in high vacuums since ion beams at the energies used in these applications would be completely attenuated by long differentially pumped sections or by foil windows which would otherwise be required for workpieces maintained at atmospheric pressure.

Figure 6:
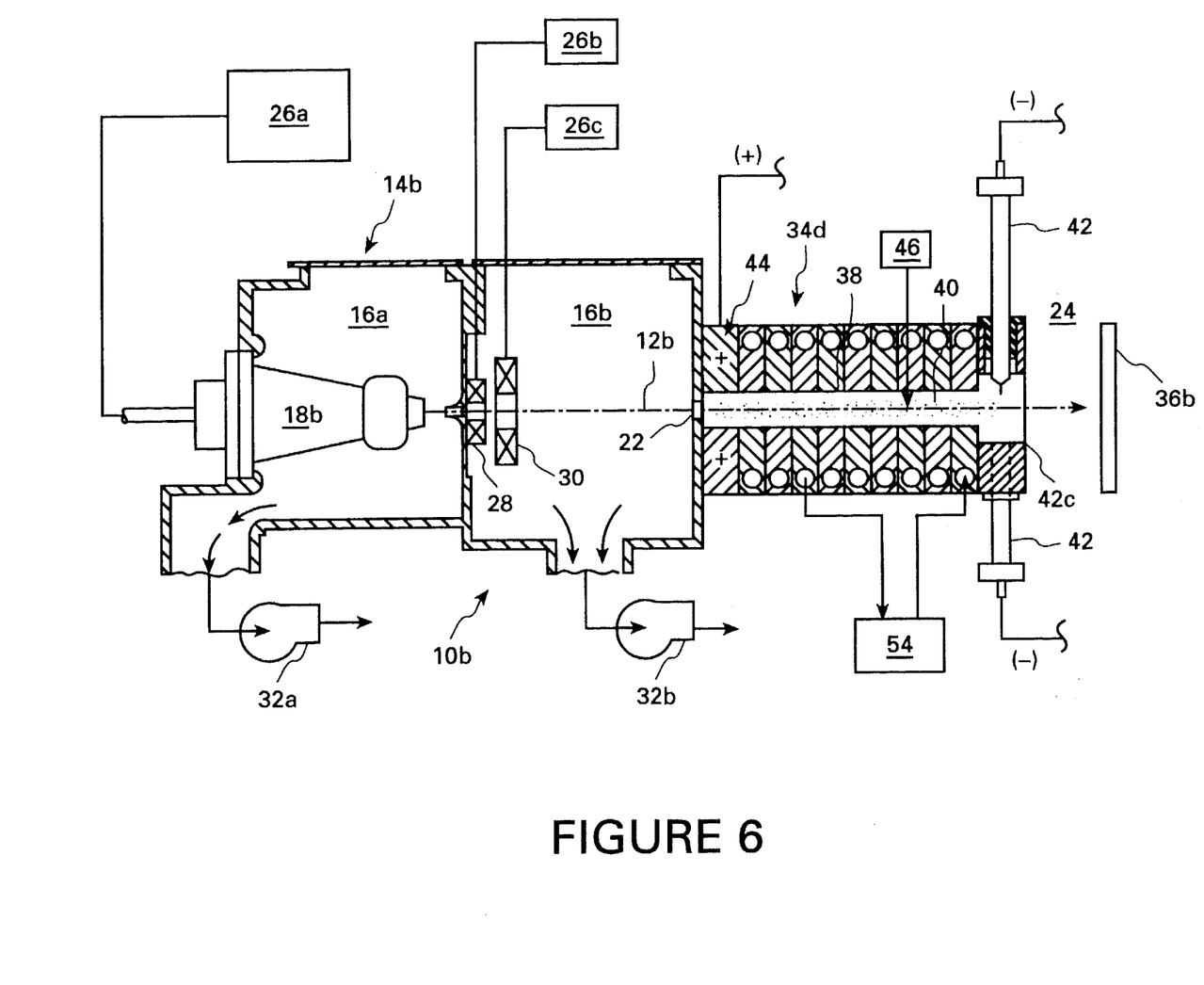
FIG. 6 is a schematic representation of a plasma interface in accordance with a fourth embodiment of the present invention joined to an ion beam particle generator and having oppositely oriented cathodes and anode for propagating the ion beam from the particle generator.

Illustrated schematically in FIG. 6 is a charged particle propagating apparatus 10B which is configured for propagating an ion beam 12b, which is positive in this example. The ion generator 14b is substantially identical to the electron beam generator 14 disclosed above except that it includes a conventional ion gun 18b for discharging the ion beam 12b. The corresponding plasma interface 34D is suitably modified for enhancing the desirable effects of the plasma 40 on the positive ion beam 12b. In the exemplary embodiment illustrated in FIG. 6, this is accomplished by simply interchanging the position or orientation of the needle cathodes 42 and the anode 44 as compared to the otherwise identical plasma interface 34 illustrated in FIG. 1. The anode 44 is disposed adjacent to the beam exit 22, and the needle cathodes 42 are disposed down-beam therefrom in the last cooling plate 52b to define a beam outlet 42c at the aft end of the plasma interface 34D. This orientation of the cathodes 42 and anode 44 relative to the propagation direction of the positive ion beam 12b ensures that heavy particles such as molecular and atomic ions migrate toward the higher pressure, atmospheric for example, region 24 to provide a flow of ions that is opposite to or counters the flow of atmospheric gas which would otherwise tend to flow through the respective plasma interfaces into the vacuum chamber 16b. The beam outlet 42c is positionable relative to another workpiece 36b which is disposed in the higher pressure region 24, at atmospheric pressure for example, for ion beam modification thereof including ion implantation, dry etching, or micro-fabrication. In this embodiment, the plasma interface 34D will also enjoy the pumping-down and beam focusing effects described above for the corresponding electron beam plasma interface 34 described above.

Figure 7:
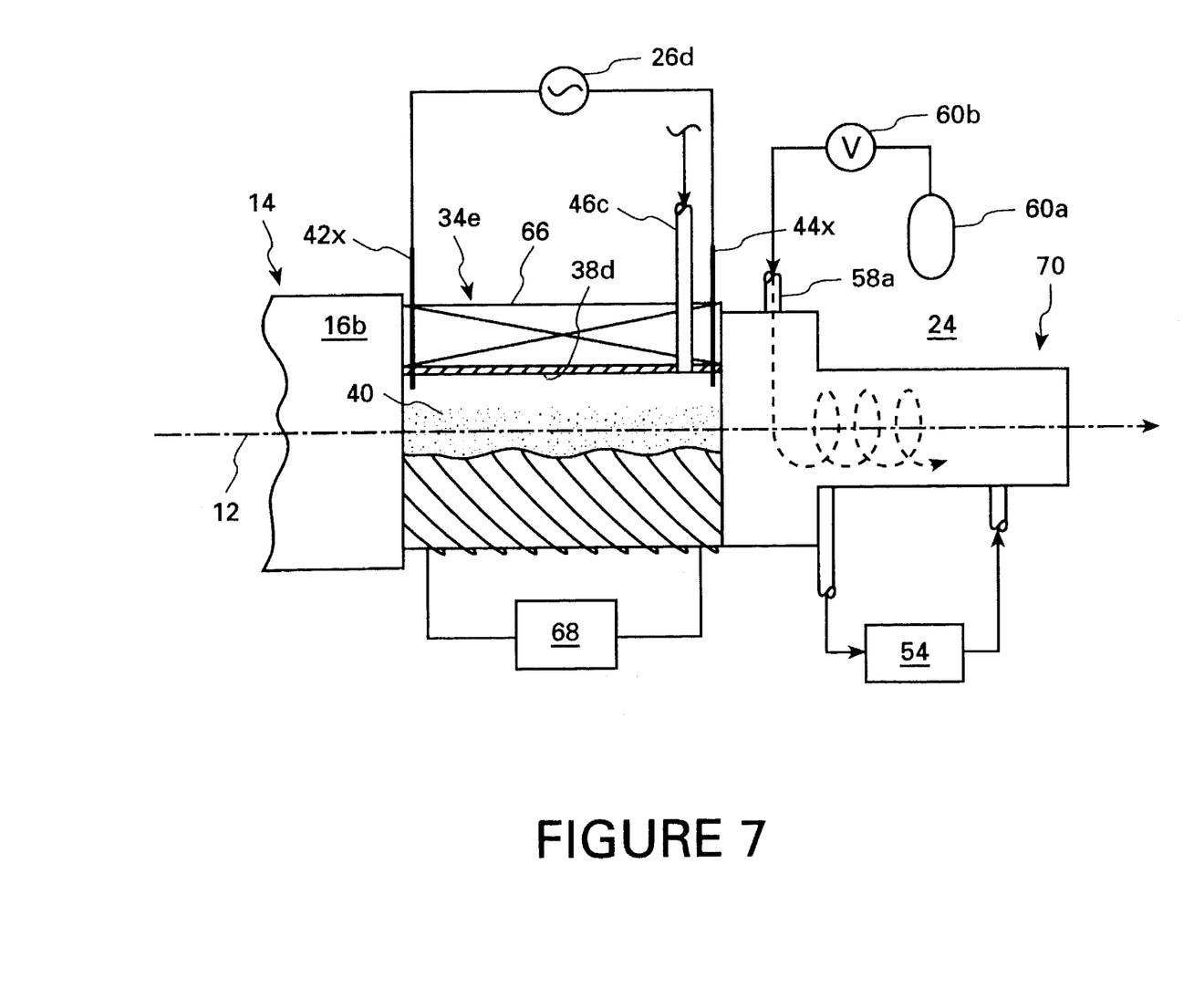
FIG. 7 is a schematic representation of a plasma interface in accordance with another embodiment of the present invention similar to FIG. 1 and including an external focusing winding therearound and a vortex stabilizer extending down-beam therefrom.

Illustrated in FIG. 7 is yet another embodiment of the present invention which includes the particle generator 14 and an uncooled plasma interface 34E in the form of a simple cylindrical tube defining the plasma channel 38d. The cathode and anode are in the form of conventional first and second antennas 42x, 44x joined to a suitable A.C. power supply 26d which is effective for generating radio frequency (RF) or inductively coupled (IC) plasmas 40 in the channel 38d. Since A.C. current is used, the antennas 42x,44x correspondingly alternate during operation as cathode and anode. An external coil or winding 66 shown schematically in FIG. 7 surrounds the plasma interface 34E around the plasma channel 38d thereof to both stabilize the plasma 40 and magnetically focus the beam 12. The winding 66 is preferably a helical coil, as opposed to a typical solenoid winding, having a suitable helical pitch for effectively generating both an axial magnetic field to stabilize the plasma 40, and an azimuthal magnetic field to magnetically focus the beam 12. The winding 66 is powered by a suitable D.C. power supply 68 for effecting the stabilizing and focusing fields.

Also in the embodiment illustrated in FIG. 7, the plasma interface 34E may include a tubular extension 70 for suitably extending the path of the electron beam 12 in the higher pressure region 24, which extension 70 may be suitably narrow for reaching more deeply into confined spaces such as crevices in workpieces. The extension 70 extends down-beam from the plasma interface 34E and coaxially therewith for channeling the plasma 40 and the beam 12 to extend the reach of the beam 12 in the higher pressure region 24. Suitable auxiliary stabilizing means are provided for circulating a cooling gas such as helium in a vortex around the plasma 40 in the extension 70 for stabilizing the plasma 40 to propagate generally coaxially with the beam 12. These auxiliary stabilizing means may be substantially identical to the vortex stabilized plasma interface 34B illustrated in FIG. 3 except that the cathodes 42 and anode 44 are not required in the extension 70. The inlet ports 58a establish a vortex around the plasma 40 in the extension 70, and the cooling fluid circulating means 54 may circulate the cooling fluid such as water around the plasma channel within the extension 70 in a manner identical to that illustrated in FIG. 3.

The various embodiments described above illustrate exemplary permutations of the invention for using a plasma interface between a vacuum operated particle generator and a higher pressure region 24. The plasma 40 effectively seals the beam exit 22 from backflow of vacuum degrading higher pressure gas from the higher pressure region 24 while allowing effective propagation of the particle beam 12, 12b without undesirable dispersion and attenuation thereof. The various embodiments of the plasma interfaces allow the atmospheric processing of workpieces in electron beam welding, electron beam melting, or ion beam material modification. In this way, conventional vacuum chambers which are used for containing various workpieces may be eliminated which correspondingly eliminates the otherwise required evacuation processing time. Higher production rates may therefore be achieved at reduced cost, with the size of the weldment or workpiece no longer is a limitation in these processes.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is claimed and desired to be secured by Letters Patent of the United States is the invention as defined and differentiated in the following claims:

1. A charged particle propagating apparatus 10 comprising:

a generator 14 including a chamber 16a,b maintainable under vacuum with a gun 18 therein for discharging a beam 12, 12b of charged particles from within said vacuum chamber 16a,b and out of said vacuum chamber 16a,b through a beam exit 22 disposed in a wall of said vacuum chamber 16b;

a higher pressure region 24 adjoining said vacuum chamber wall at said beam exit 22 maintainable at a pressure greater than said vacuum in said vacuum chamber 16a,b; and a plasma interface 34 disposed at said beam exit 22 and including a channel 38 for bounding a plasma 40 maintainable between a cathode 42 and an anode 44 disposed at opposite ends thereof, said plasma channel 38 being aligned with said beam exit 22 for propagating said beam 12 from said vacuum chamber 16a,b, through said plasma 40, and into said higher pressure region 24, and said plasma 40 being effective for pumping down said beam exit 22 for preventing pressure increase in said vacuum chamber 16b due to flow communication with said higher pressure region 24.

2. An apparatus according to claim 1 wherein said plasma interface 34 further comprises:

means 46 for injecting a plasma-forming gas into said plasma channel 38 between said cathode 42 and said anode 44; and means 48a,b for supplying electrical power to said cathode 42 and said anode 44 to form said plasma 40 therebetween in said plasma channel 38.

3. An apparatus according to claim 2 wherein:

said cathode comprises a plurality of circumferentially spaced apart needle cathodes 42 having distal ends disposed adjacent to said plasma channel 38; and said power supplying means effect a D.C. electrical current in said plasma 40 for magnetically focusing said beam 12,12b.

4. An apparatus according to claim 3 wherein said plasma channel 38 is elongate, and further comprising means 52 for stabilizing said plasma 40 in said elongate plasma channel 38 generally coaxially with said beam 12.

5. An apparatus according to claim 4 wherein said plasma channel 38 has a length and a diameter, and said length is greater than said diameter for effecting said elongate plasma channel 38.

6. An apparatus according to claim 5 wherein said stabilizing means are effective for providing a lower temperature boundary around said plasma 40.

7. An apparatus according to claim 6 wherein said stabilizing means comprise:

a plurality of stacked annular cooling plates 52 collectively having a central bore defining said plasma channel 38 therethrough; and means 54 for circulating a cooling fluid through said cooling plates 52 to remove heat therefrom.

8. An apparatus according to claim 6 wherein said stabilizing means are effective for circulating a cooling gas in a vortex around said plasma 40 in said plasma channel 38.

9. An apparatus according to claim 8 wherein said stabilizing means comprise:

a tubular cooling channel 56 disposed concentrically around a downstream portion of said plasma channel 38b;

an inlet plenum 58 defined at an upstream end of said plasma channel 38b and having a plurality of generally tangentially inclined inlet ports 58a therein;

means 54 for circulating a cooling fluid through said cooling channel 56; and means 60a,b for supplying said cooling gas to said inlet ports 58a to form said vortex around said plasma 40.

10. An apparatus according to claim 6 wherein said stabilizing means are effective for discharging a cooling gas through said plasma channel 38c to effect transpiration cooling around said plasma 40 therein.

11. An apparatus according to claim 10 wherein said stabilizing means comprise:

a tubular cooling duct 64 disposed concentrically around said plasma channel 38c;

a plurality of transpiration cooling holes 62 extending radially through said plasma channel 38c; and means 60a,b for supplying said cooling gas through said transpiration cooling holes 62.

12. An apparatus according to claim 6 wherein:

said particle gun 18 is effective for discharging an electron beam 12;

said needle cathodes 42 are disposed adjacent to said beam exit 22, and said anode 44 is disposed down-beam therefrom and defines a beam outlet 44a from said plasma interface 34; and said beam outlet 44a is positionable relative to a workpiece 36 disposed in said higher pressure region 24 for electron beam welding thereof.

13. An apparatus according to claim 12 wherein said higher pressure region 24 is maintained at atmospheric pressure, and said plasma interface 34 is effective for pumping down said vacuum chamber 16b.

14. An apparatus according to claim 6 wherein:

said particle gun 18b is effective for discharging an ion beam 12b;

said anode 44 is disposed adjacent to said beam exit 22, and said needle cathodes are disposed down-beam therefrom to define a beam outlet 42c from said plasma interface 34D; and said beam outlet 42c is positionable relative to a workpiece 36b disposed in said higher pressure region 24 for ion beam modification thereof including ion implantation, dry etching, or micro-fabrication.

15. An apparatus according to claim 14 herein said higher pressure region 24 is maintained at atmospheric pressure, and said plasma interface 34 is effective for pumping down said vacuum chamber 16b.

16. An apparatus according to claim 6 further comprising:

a tubular extension 70 extending down-beam from said plasma interface 34 and coaxially therewith for channeling said plasma 40 and beam 12 to extend the reach of said beam 12 in said higher pressure region 24; and auxiliary stabilizing means for circulating a cooling gas in a vortex around said plasma 40 in said extension 70 for stabilizing said plasma 40 to propagate generally coaxially with said beam 12.

17. An apparatus according to claim 2 further comprising an external winding 66 surrounding said plasma interface 34E, and being powered to generate axial and azimuthal magnetic fields in said plasma channel 38*d* for both stabilizing said plasma 40 and focusing said beam 12 therein.

18. A method of propagating a charged particle beam 12 from a vacuum to a higher pressure region 24 comprising:

generating said charged particle beam 12 in said vacuum;

forming a plasma 40; and propagating said beam 12 through said plasma 40 from said vacuum and into said higher pressure region 24.

19. A method according to claim 18 wherein said plasma forming step comprises:

injecting a plasma-forming gas into a plasma channel 38 between a cathode 42 and an anode 44; and supplying electrical power to said cathode 42 and said anode 44 to form said plasma 40 therebetween in said plasma channel 38.

20. A method according to claim 19 further comprising:

elongating said plasma 40; and stabilizing said elongate plasma 40 generally coaxially with said beam 12.

21. A method according to claim 20 wherein said cathode comprises a plurality of circumferentially spaced apart needle cathodes 42 having distal ends disposed adjacent to said plasma channel 38.

22. A method according to claim 21 wherein said stabilizing step comprises providing a lower temperature boundary around said plasma 40.

23. A method according to claim 22 wherein said stabilizing step comprises circulating a cooling fluid around said plasma channel 38 to remove heat therefrom.

24. A method according to claim 22 wherein said stabilizing step comprises circulating a cooling gas in a vortex around said plasma 40 in said plasma channel 38.

25. A method according to claim 22 wherein said stabilizing step comprises discharging a cooling gas through said plasma channel 38*c* to effect transpiration cooling around said plasma 40 therein.

26. A method according to claim 22 wherein said particle beam is an electron beam 12 propagating through said plasma channel 38 from said needle cathodes 42 to said anode 44 for magnetically focusing said beam 12, and is discharged from said anode 44 into said higher pressure region 24; and said method further comprises welding with said electron beam 12 a workpiece 36 disposed in said higher pressure region 24.

27. A method according to claim 26 wherein said higher pressure region 24 is maintained at atmospheric pressure, and said plasma 40 pumps down said vacuum chamber 16*b*.

28. A method according to claim 22 wherein said particle beam is an ion beam 12*b* propagating through said plasma channel 38 from said anode 44 to said needle cathodes 42 for magnetically focusing said beam 12*b*, and is discharged from said needle cathodes 42 into said higher pressure region 24; and said method further comprises ion modifying with said ion beam 12*b* a workpiece 36*b* disposed in said higher pressure region 24.

29. A method according to claim 28 wherein said higher pressure region 24 is maintained at atmospheric pressure, and said plasma 40 pumps down said vacuum chamber 16*b*.

30. A method according to claim 20 wherein said stabilizing step comprises providing an axial magnetic field in said plasma 40, and further comprising generating an azimuthal magnetic field in said plasma 40 for magnetically focusing said beam 12,12*b*.

\* \* \* \* \*